US009460921B2

(12) United States Patent
Bertness et al.

(10) Patent No.: US 9,460,921 B2
(45) Date of Patent: Oct. 4, 2016

(54) NANOWIRE ARTICLE AND PROCESSES FOR MAKING AND USING SAME

(71) Applicants: NATIONAL INSTITUTE OF STANDARDS AND TECHNOLOGY, Gaithersburg, MD (US); Matthew D. Brubaker, Louisville, CO (US); William M. Old, Denver, CO (US)

(72) Inventors: Kristine A. Bertness, Boulder, CO (US); Matthew D. Brubaker, Louisville, CO (US); William M. Old, Denver, CO (US)

(73) Assignees: THE UNITED STATES OF AMERICA, AS REPRESENTED BY THE SECRETARY OF COMMERCE, Washington, DC (US); REGENTS OF THE UNIVERISTY OF COLORADO, Denver, CO (US)

( * ) Notice: Subject to any disclaimer, the term of this patent is extended or adjusted under 35 U.S.C. 154(b) by 0 days.

(21) Appl. No.: 14/679,249

(22) Filed: Apr. 6, 2015

(65) Prior Publication Data

US 2015/0214050 A1 Jul. 30, 2015

(51) Int. Cl.
*B82Y 35/00* (2011.01)
*B82Y 40/00* (2011.01)
(Continued)

(52) U.S. Cl.
CPC ......... *H01L 21/02603* (2013.01); *B82Y 35/00* (2013.01); *B82Y 40/00* (2013.01);
(Continued)

(58) Field of Classification Search
CPC ... C30B 29/403; C30B 29/406; B82Y 35/00; B82Y 40/00; B82Y 10/00; H01L 21/0254; H01L 29/0665; H01L 21/02603
See application file for complete search history.

(56) References Cited

U.S. PATENT DOCUMENTS 7,078,863 B2  7/2006  Joyce
7,528,002 B2 *  5/2009  Samuelson ............. C30B 11/12
                                                    438/483

(Continued)

OTHER PUBLICATIONS

J.A. Stolee et al., Laser-nanostructure interactions for ion production, Physical Chemistry Chemical Physics, 2012, 8453-8471, vol. 14.

(Continued)

*Primary Examiner* — Evan Pert
(74) *Attorney, Agent, or Firm* — Toby D. Hain

(57) ABSTRACT

A nanowire article includes a substrate; a plurality of nanowires disposed on the substrate, the nanowires comprising a semiconductor nitride, the semiconductor comprising an element selected from group 3 of the periodic table; and a superlattice layer interposed between the substrate and the plurality of gallium nitride nanowires. A process for producing a nanowire article includes disposing a superlattice layer on a substrate; disposing a first buffer layer on the superlattice layer; contacting the first buffer layer with a precursor; and forming a plurality of nanowires from the precursor on the first buffer layer to form the nanowire article, the nanowires comprising a semiconductor nitride, the semiconductor comprising an element selected from group 3 of the periodic table. A process for producing a nanowire article includes nitrogenating a substrate to form a nitrogenated layer on the substrate; contacting the nitrogenated layer with a precursor; and forming a plurality of gallium nitride nanowires from the precursor on the nitrogenated layer to form the nanowire article in an absence of a catalyst, wherein individual gallium nitride nanowires of the plurality of gallium nitride nanowires include a length axis that is substantially perpendicular to the nitrogenated layer.

20 Claims, 12 Drawing Sheets

(51) Int. Cl.
  *H01L 21/18* (2006.01)
  *C30B 29/40* (2006.01)
  *H01L 21/02* (2006.01)

(52) U.S. Cl.
  CPC .......... *C30B 29/403* (2013.01); *C30B 29/406* (2013.01); *H01L 21/0254* (2013.01); *H01L 21/02381* (2013.01); *H01L 21/02433* (2013.01); *H01L 21/02439* (2013.01); *H01L 21/02458* (2013.01); *H01L 21/02507* (2013.01); *H01L 21/02642* (2013.01)

(56) References Cited

U.S. PATENT DOCUMENTS

| | | | |
|---|---|---|---|
| 7,608,147 B2 * | 10/2009 | Samuelson | B82Y 10/00 117/12 |
| 7,655,902 B2 | 2/2010 | Choi et al. | |
| 8,716,045 B2 | 5/2014 | Hersee et al. | |
| 8,790,462 B2 * | 7/2014 | Samuelson | B82Y 10/00 117/12 |
| 8,796,119 B2 * | 8/2014 | Samuelson | B82Y 10/00 257/E21.404 |
| 9,096,429 B2 * | 8/2015 | Samuelson | B82Y 10/00 |
| 2004/0175844 A1 * | 9/2004 | Yang | B82Y 10/00 438/2 |
| 2006/0180755 A1 | 8/2006 | Chang et al. | |
| 2007/0001220 A1 * | 1/2007 | Tombler | B82Y 10/00 257/330 |
| 2013/0200391 A1 * | 8/2013 | Bedair | H01L 21/0237 257/76 |
| 2014/0145143 A1 * | 5/2014 | Tombler, Jr. | B82Y 10/00 257/9 |

OTHER PUBLICATIONS

P.A. Kuzema, Small-Molecule Analysis by Surface-Assisted Laser Desorption/Ionization Mass Spectrometry, Journal of Analytical Chemistry, 2011, 1227-1242, vol. 66, No. 13.

M.-J. Kang et al., Nanowire-assisted laser desorption and ionization mass spectrometry for quantitative analysis of small molecules, Rapid Communications in Mass Spectrometry, 2005, 3166-3170, vol. 19.

K.A. Bertness et al., Controlled nucleation of GaN nanowires grown with molecular beam epitaxy, Advanced Functional Materials, 2010, 2911-2915, vol. 20.

M.D. Brubaker et al., Effect of AlN buffer layer properties on the morphology and polarity of GaN nanowires grown by molecular beam epitaxy, Journal of Applied Physics, 2011, 053506, vol. 110.

S. Dasgupta et al., Growth and Characterization of N-Polar GaN Films on Si(111) by Plasma Assisted Molecular Beam Epitaxy, Japanese Journal of Applied Physics, 2012, 115503, vol. 51, No. 11.

V. Lebedev et al., The polarity of AlN films grown on Si(111), Journal of Crystal Growth, 1999, 266-272, vol. 207.

S. Albert et al., Selective area growth of In(Ga)N/GaN nanocolumns by molecular beam epitaxy on GaN-buffered Si (111): from ultraviolet to infrared emission, Nanotechnology, 2013, 175303, vol. 24, No. 17.

K. Kishino et al., Improved Ti-mask selective-area growth (SAG) by rf-plasma-assisted molecular beam epitaxy demonstrating extremely uniform GaN nanocolumn arrays, Journal of Crystal Growth, 2009, 2063-2068, vol. 311, No. 7.

J.A. Stolee et al., Polarization dependent fragmentation of ions produced by laser desorption from nanopost arrays, Physical Chemistry Chemical Physics, 2011, 9140-9146, vol. 13.

* cited by examiner

NANOWIRE ARTICLE AND PROCESSES FOR MAKING AND USING SAME

STATEMENT REGARDING FEDERALLY SPONSORED RESEARCH

This invention was made with United States government support from the National Institute of Standards and Technology. The government has certain rights in the invention.

BRIEF DESCRIPTION

Disclosed is a nanowire article comprising: a substrate; a plurality of nanowires disposed on the substrate, the nanowires comprising a semiconductor nitride, the semiconductor comprising an element selected from group 3 of the periodic table; and a superlattice layer interposed between the substrate and the plurality of gallium nitride nanowires.

Further disclosed is a process for producing a nanowire article, the process comprising: disposing a superlattice layer on a substrate; disposing a first buffer layer on the superlattice layer; contacting the first buffer layer with a precursor; and forming a plurality of nanowires from the precursor on the first buffer layer to form the nanowire article, the nanowires comprising a semiconductor nitride, the semiconductor comprising an element selected from group 3 of the periodic table.

Also disclosed is a process for producing a nanowire article, the process comprising: nitrogenating a substrate to form a nitrogen layer on the substrate; contacting the nitrogen layer with a precursor; and forming a plurality of gallium nitride nanowires from the precursor on the nitrogen layer to form the nanowire article in an absence of a catalyst, wherein individual gallium nitride nanowires of the plurality of gallium nitride nanowires comprise a length axis that is substantially perpendicular to the nitrogen layer.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments is presented herein by way of exemplification and not limitation.

It has been discovered that a nanowire article herein provides high-efficiency laser desorption and ionization of analytes without use of co-crystallized organic matrix. Nanowires included in the nanowire article concentrate, e.g., laser excitation to desorb or ionize the analyte.

Figure 1A:
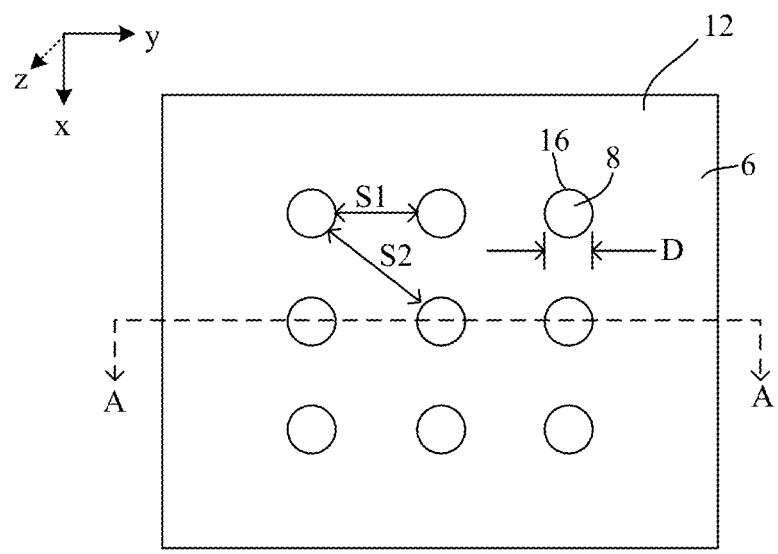
FIGS. 1A and 1B respectively show a top view (FIG. 1A) and a cross-section (FIG. 1B) of an embodiment of a nanowire article.
Figure 1B:
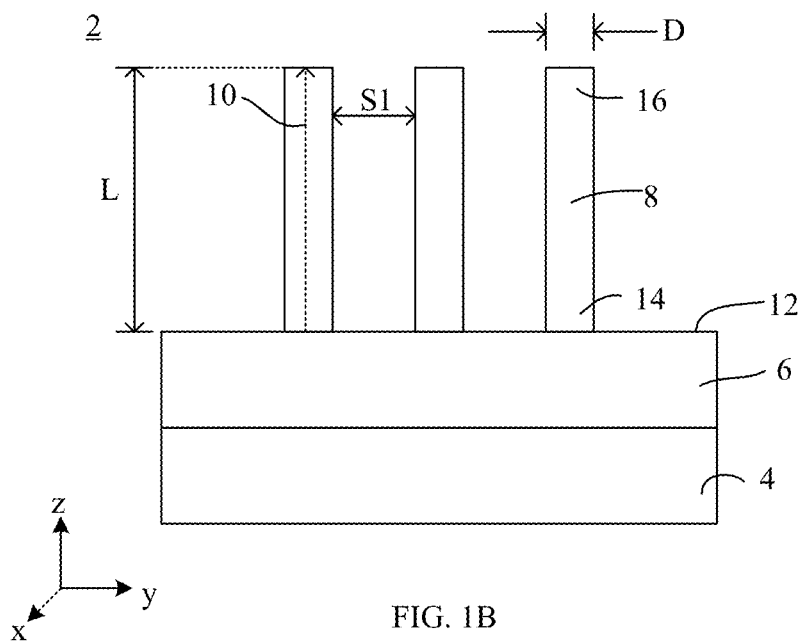

In an embodiment, as shown in FIG. 1A (top view of nanowire article 2) and FIG. 1B (cross-section of nanowire article 2 along line A-A shown in FIG. 1A), nanowire article 2 includes superlattice layer 6 disposed on substrate 4 and a plurality of nanowires 8 disposed on a surface 12 of superlattice layer 6. Nanowires 8 have length axis 10 that extends from proximate end 14 at surface 12 to distal end 16. According to an embodiment, the wires 8 can have a selected, deterministic arbitrary spacing or pattern. Here, first spacing S1 separates nearest neighbor nanowires 8. Further, nanowires 8 can be separated from one another by second spacing S2, wherein first spacing S1 and second spacing S2 are different or substantially the same. Nanowires 8 also have diameter D that is substantially similar among nanowires 8 in an embodiment. Optionally, diameter D can be a distribution of sizes. Length L of nanowires 8 can be controlled, e.g., during growth of nanowires 8. Length L can substantially similar among nanowires 8 in an embodiment. Optionally, length L can be a distribution of lengths.

Figure 2A:
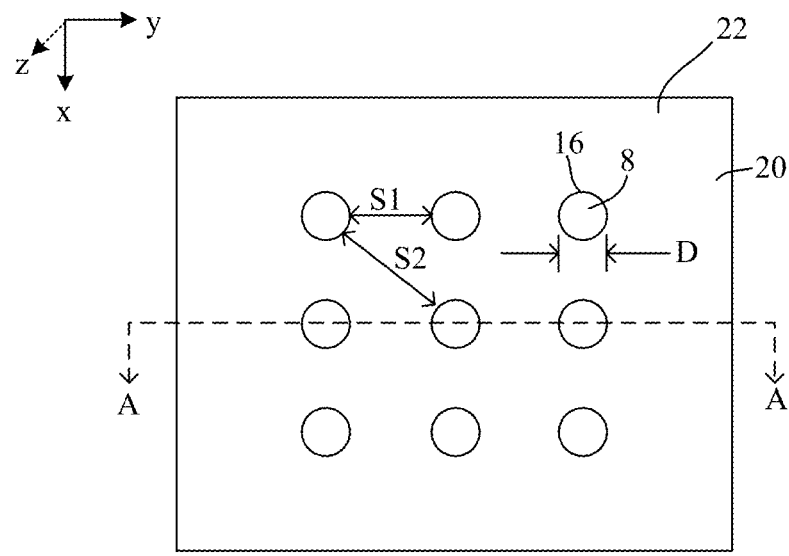
FIGS. 2A and 2B respectively show a top view (FIG. 2A) and a cross-section (FIG. 2B) of an embodiment of a nanowire article.
Figure 2B:
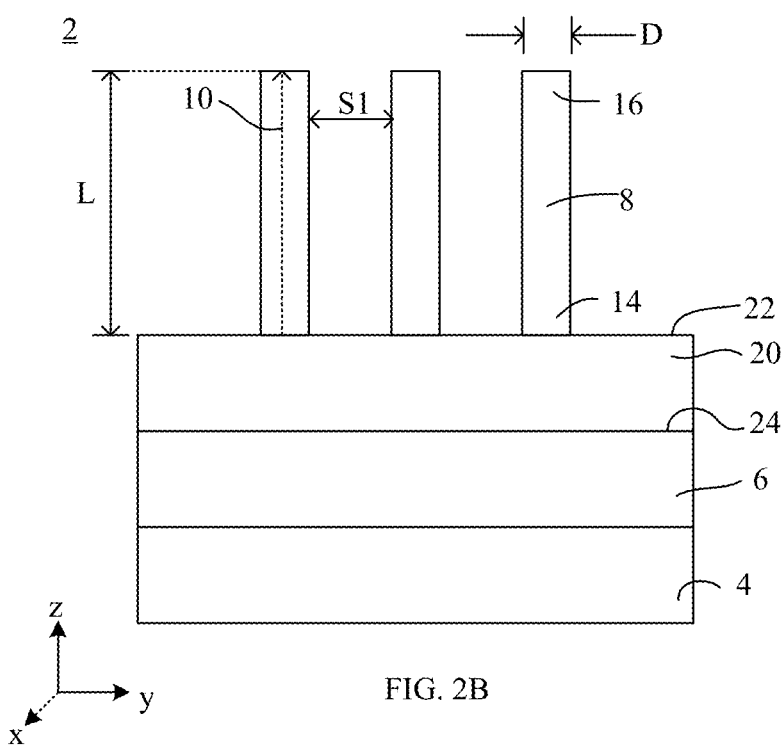

According to an embodiment shown in FIG. 2A (top view of nanowire article 2) and FIG. 2B (cross-section of nanowire article 2 along line A-A shown in FIG. 2A), nanowire article 2 includes first buffer layer 20 interposed between superlattice layer 6 and proximate end 14 of nanowires 8. Here, proximate end 14 can be in direct contact with first polar surface 22 of first buffer layer 20, and second polar surface 24 of first buffer layer 20 contacts superlattice layer 6. It is contemplated that a polarity of first polar surface 22 controls a direction of a polarity axis of nanowires 8 such that the polarity axis is anisotropically directed along length axis 10, i.e., parallel to z-axis in the inset coordinate system shown in FIG. 2B. In an embodiment, first polar surface 22 is a negative polar surface relative to second polar surface 24, and second polar surface 24 is a positive polar surface relative to first polar surface 22. In a certain embodiment, the negative polar surface of first polar surface 22 is a nitrogen polar surface (also referred to as N-polar surface, where "N" stands for the elemental symbol for nitrogen and not the word "negative"), and the positive polar surface of second polar surface 24 is a metal atom polar surface (also referred to as m-polar surface, e.g., an aluminum polar surface is referred to as Al-polar surface). In some embodiments, first polar surface 22 is a positive polar surface relative to second polar surface 24, and second polar surface 24 is a negative polar surface relative to first polar surface 22.

Figure 3A:
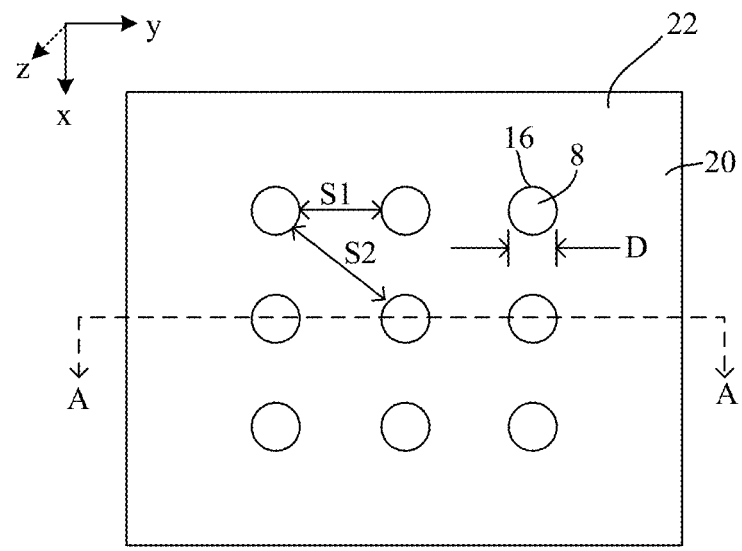
FIGS. 3A and 3B respectively show a top view (FIG. 3A) and a cross-section (FIG. 3B) of an embodiment of a nanowire article.
Figure 3B:
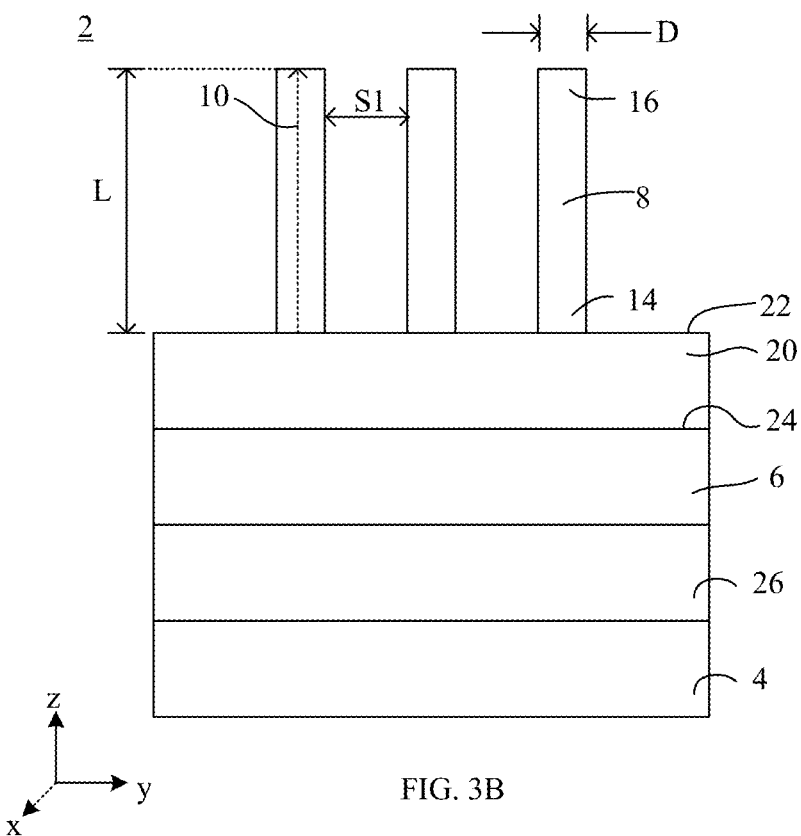

In an embodiment, as shown in FIG. 3A (top view of nanowire article 2) and FIG. 3B (cross-section of nanowire article 2 along line A-A shown in FIG. 3A), nanowire article 2 includes second buffer layer 26 interposed between substrate 4 and superlattice layer 6.

Figure 4A:
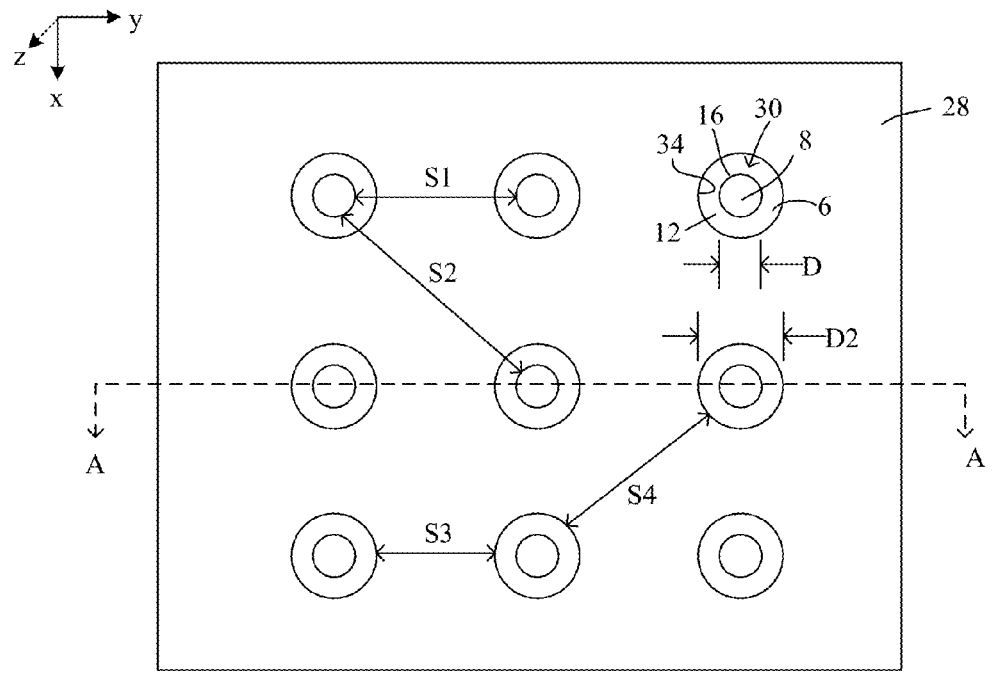
FIGS. 4A and 4B respectively show a top view (FIG. 4A) and a cross-section (FIG. 4B) of an embodiment of a nanowire article.
Figure 4B:
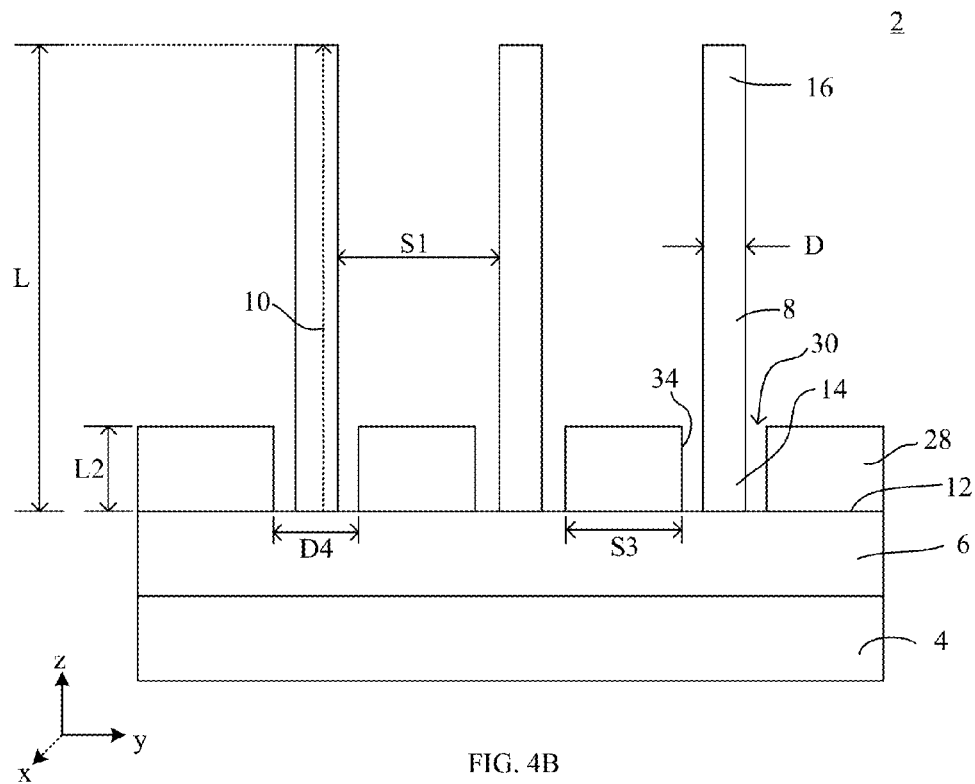

According to an embodiment shown in FIG. 4A (top view of nanowire article 2) and FIG. 4B (cross-section of nanowire article 2 along line A-A shown in FIG. 4A), nanowire article 2 includes superlattice layer 6 disposed on substrate 4 and mask 28 disposed on surface 12 of superlattice layer 6. Mask 28 includes a plurality of holes 30, wherein wall 34 bounds hole 30. Nanowires 8 are disposed on surface 12 of superlattice 6 through holes 30 of mask 28 such that nanowires 8 contact surface 12. As discussed more fully below, mask 28 is disposed on superlattice layer 6 prior to growth of nanowires 8. Here, holes 30 of mask 28 have a selected, deterministic arbitrary spacing or pattern. Nearest neighbor holes 30 can be separated by third spacing S3. Further, holes 30 can be separated from one another by fourth spacing S4, wherein third spacing S3 and fourth spacing S4 are different or substantially the same. A depth of holes 30 can be the same as a width of mask 28 such as length L2. A shape of holes 30 can be any shape effective to grow nanowires 8 on surface 12, e.g., circular, polygonal, irregularly shaped, and the like. Size D4 of holes 30 can be any size effective to grow nanowires 8 on surface 12 or with a certain tolerance for growth of nanowires 8 therethrough. It is contemplated that in some embodiments the pattern of holes 30 are template for a pattern of nanowires 8. Furthermore, according to an embodiment, a single nanowire 8 is present in a single hole 30. In an embodiment, then wire 8 is present in all holes 30 or a portion of holes 30. In a certain embodiment, a space between wall 34 and nanowire 8 is filled with a filler (not shown in FIG. 4A or 4B but which can be, e.g., a composition including a metal, oxide, nitride, phosphide, and the like).

Figure 5A:
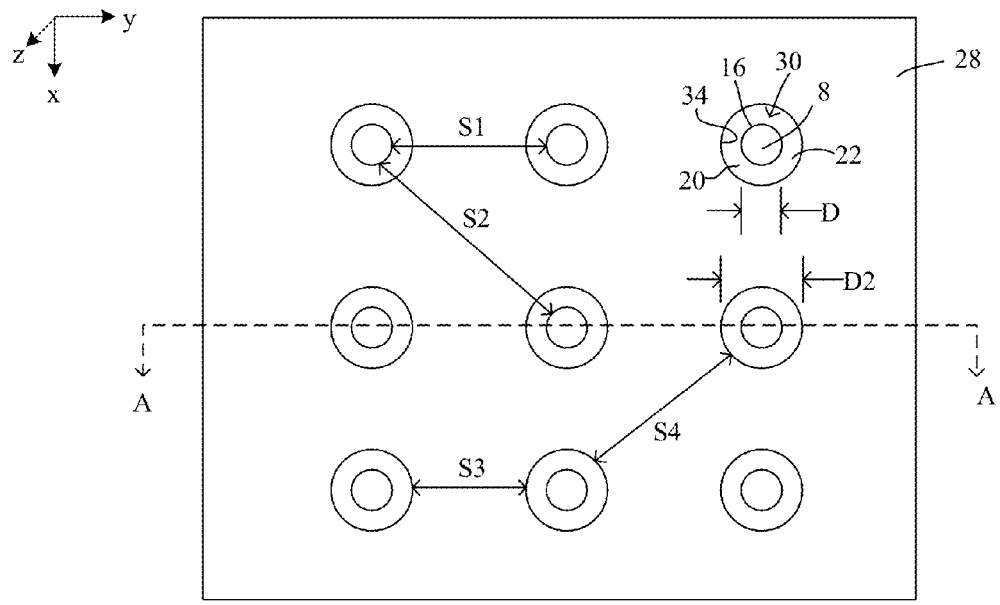
FIGS. 5A and 5B respectively show a top view (FIG. 5A) and a cross-section (FIG. 5B) of an embodiment of a nanowire article.
Figure 5B:
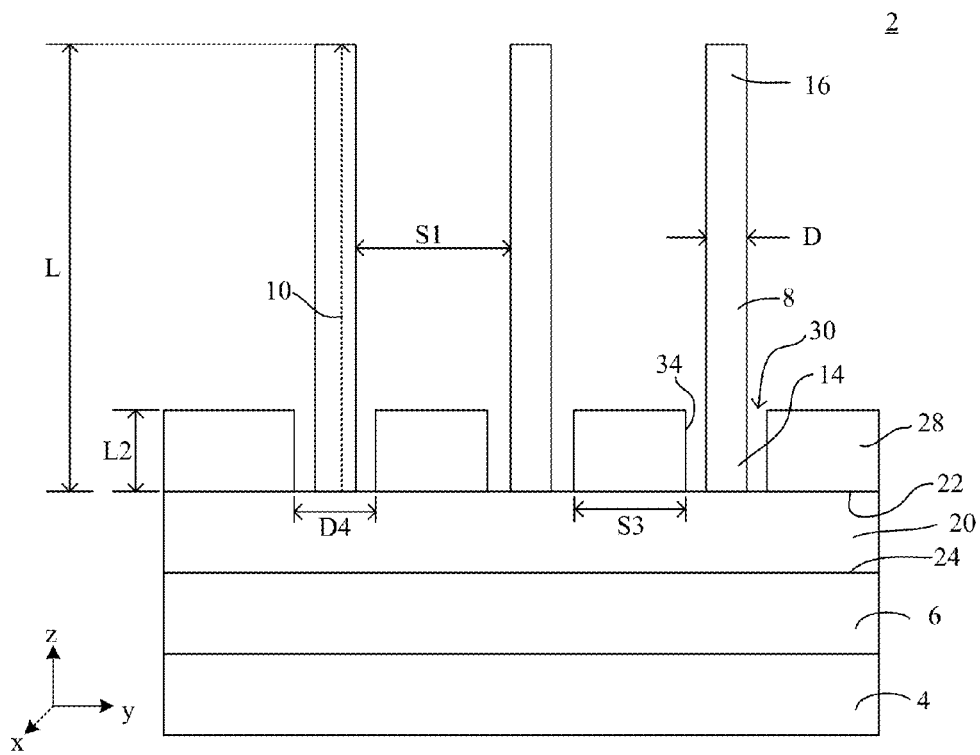

In an embodiment, as shown in FIG. 5A (top view of nanowire article 2) and FIG. 5B (cross-section of nanowire article 2 along line A-A shown in FIG. 5A), nanowire article 2 includes first buffer layer 20 interposed between superlattice layer 6 and proximate end 14 of nanowires 8. Here, proximate end 14 can be in direct contact with first polar surface 22 of first buffer layer 20, and second polar surface 24 of first buffer layer 20 contacts superlattice layer 6. It is contemplated that a polarity of first polar surface 22 controls a direction of a polarity axis of nanowires 8 such that the polarity axis is anisotropically directed along length axis 10, i.e., parallel to z-axis in the inset coordinate system shown in FIG. 5B. In an embodiment, first polar surface 22 is the negative polar surface, and second polar surface 24 is the positive polar surface. In a certain embodiment, the negative polar surface of first polar surface 22 is the N-polar surface, and the positive polar surface of second polar surface 24 is the m-polar surface. In some embodiments, first polar surface 22 is the positive polar surface, and second polar surface 24 is the negative polar surface.

Figure 6:
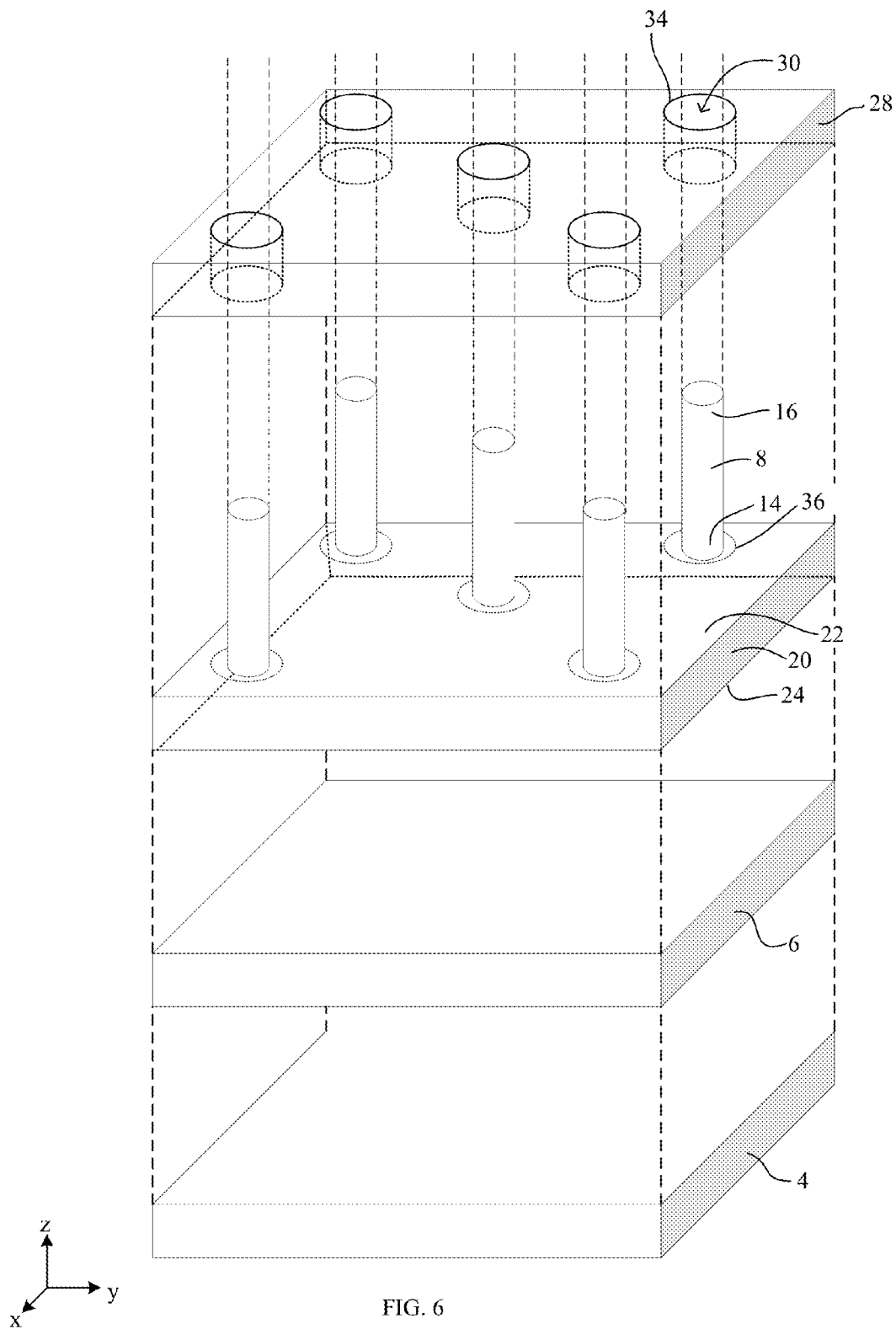
FIG. 6 shows an exploded view of the article shown in FIGS. 5A and 5B.

An exploded view of nanowire article 2 is shown in FIG. 6 for the embodiment shown in cross-section in FIG. 5B and top view in FIG. 5A. Here, contact area 36 between walls 34 and first polar surface 22 of first buffer layer 20 are indicated by dashed curves for reference.

Figure 7A:
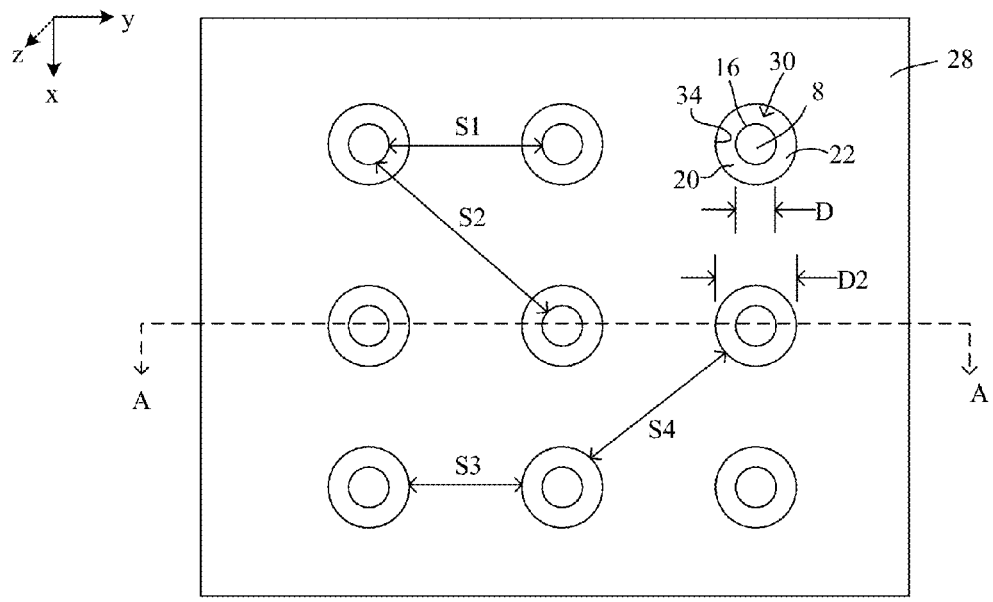
FIGS. 7A and 7B respectively show a top view (FIG. 7A) and a cross-section (FIG. 7B) of an embodiment of a nanowire article.
Figure 7B:
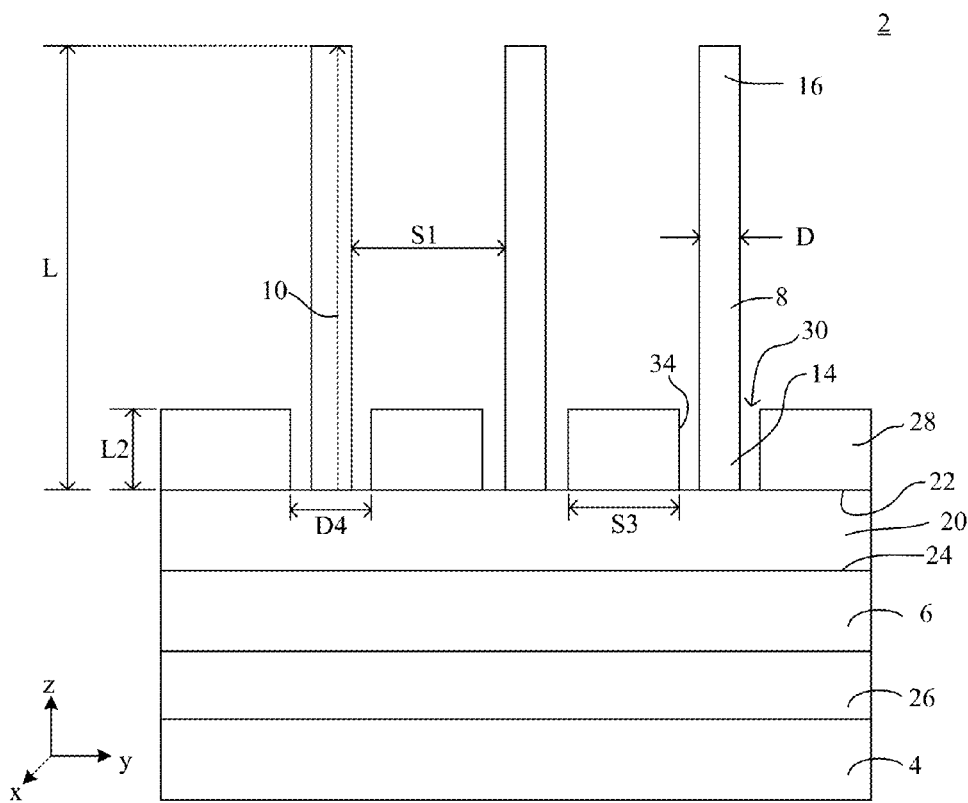

According to an embodiment shown in FIG. 7A (top view of nanowire article 2) and FIG. 7B (cross-section of nanowire article 2 along line A-A shown in FIG. 7A), nanowire article 2 includes second buffer layer 26 interposed between substrate 4 and superlattice layer 6.

It is contemplated that nanowires 8 in previous embodiments are grown via selective epitaxy in an absence of a catalyst. In an embodiment, mask 28 provides holes 30 through which nanowires 8 grow on first polar surface 22 of first buffer layer 20. In this manner, nanowires 8 are arranged in a selected nonrandom pattern since the pattern of holes 30 provides the areas on substrate 4 on which nanowires 8 grow and are present.

Figure 8A:
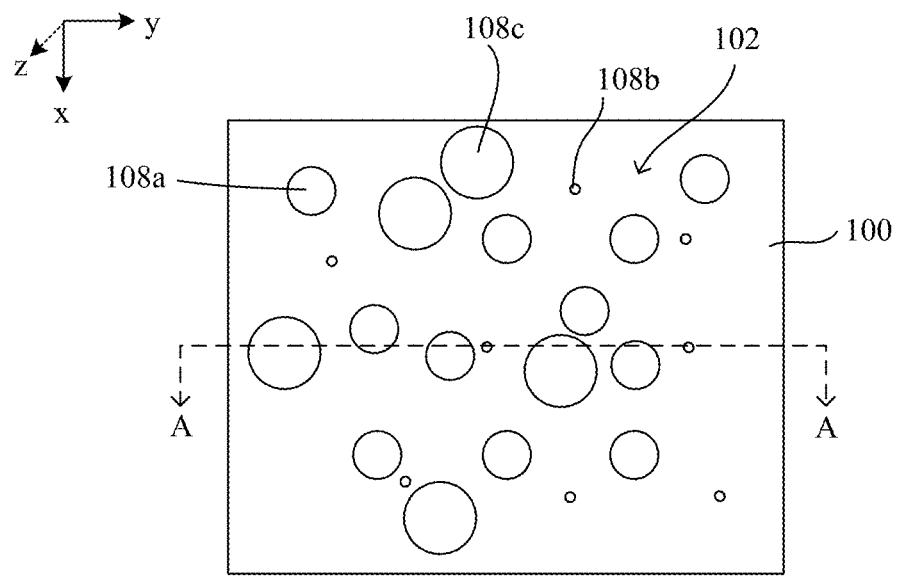
FIGS. 8A and 8B respectively show a top view (FIG. 8A) and a cross-section (FIG. 8B) of an embodiment of a nanowire article.
Figure 8B:
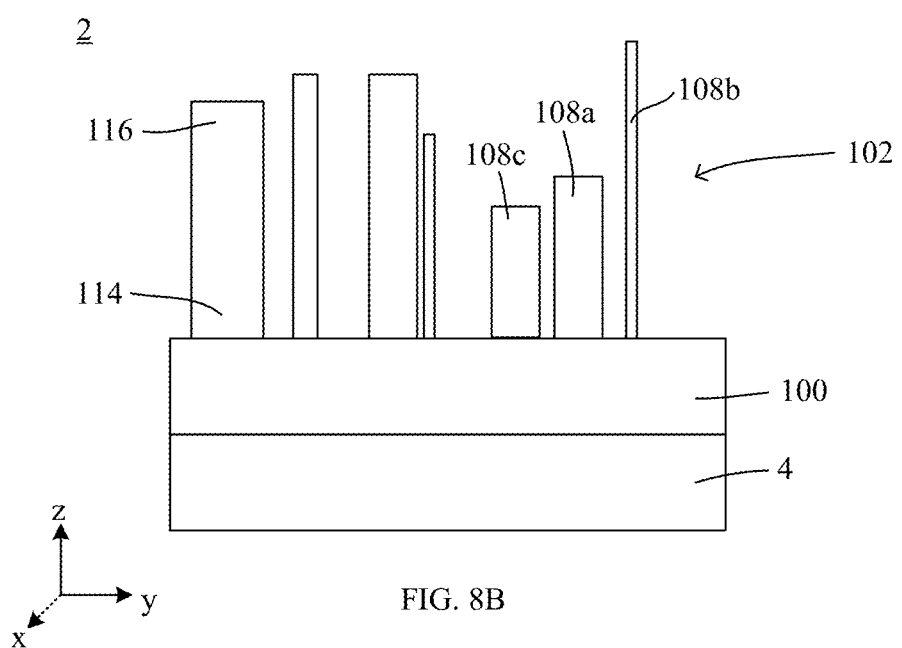

In some embodiments, as shown in FIG. 8A (top view of nanowire article 2) and FIG. 8B (cross-section of nanowire article 2 along line A-A shown in FIG. 8A), article 2 includes a plurality of randomly disposed nanowires that includes first randomly disposed nanowire 108a, second randomly disposed nanowire 108b, and third randomly disposed nanowire 108c respectively with first diameter D1, second diameter D2, and third diameter D3, which can be the same or different. Moreover, randomly disposed nanowires (108a, 108b, 108c) have various lengths and are disposed on nitrogenated layer 100 and substrate 4. Here, nitrogenated layer 100 is a product of nitrogenating substrate 4 prior to growth of randomly disposed nanowires (108a, 108b, 108c) in an absence of a catalyst. It is contemplated that randomly disposed nanowires (108a, 108b, 108c) are arranged randomly on nitrogenated layer 100 with a random spacing amongst individual randomly disposed nanowires (108a, 108b, 108c).

Figure 9A:
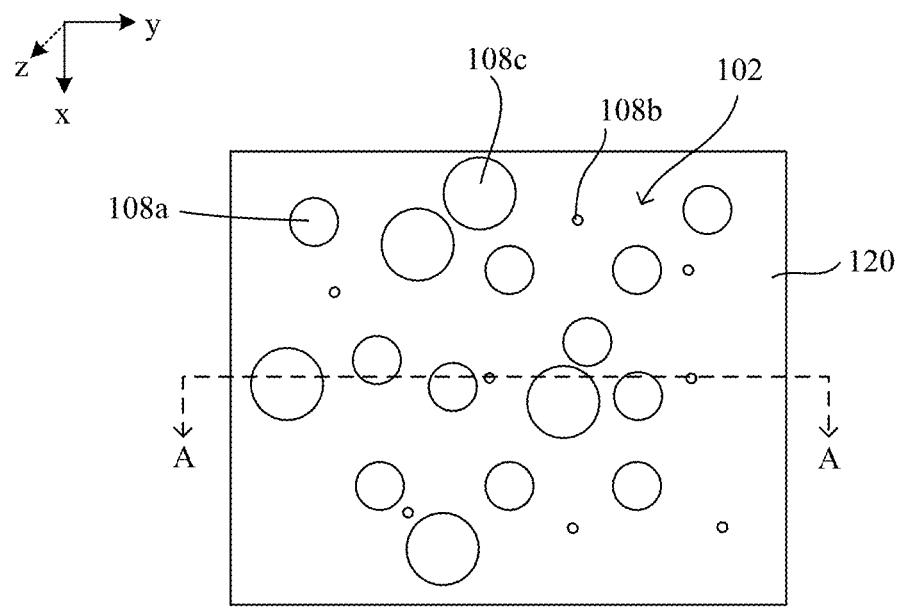
FIGS. 9A and 9B respectively show a top view (FIG. 9A) and a cross-section (FIG. 9B) of an embodiment of a nanowire article.
Figure 9B:
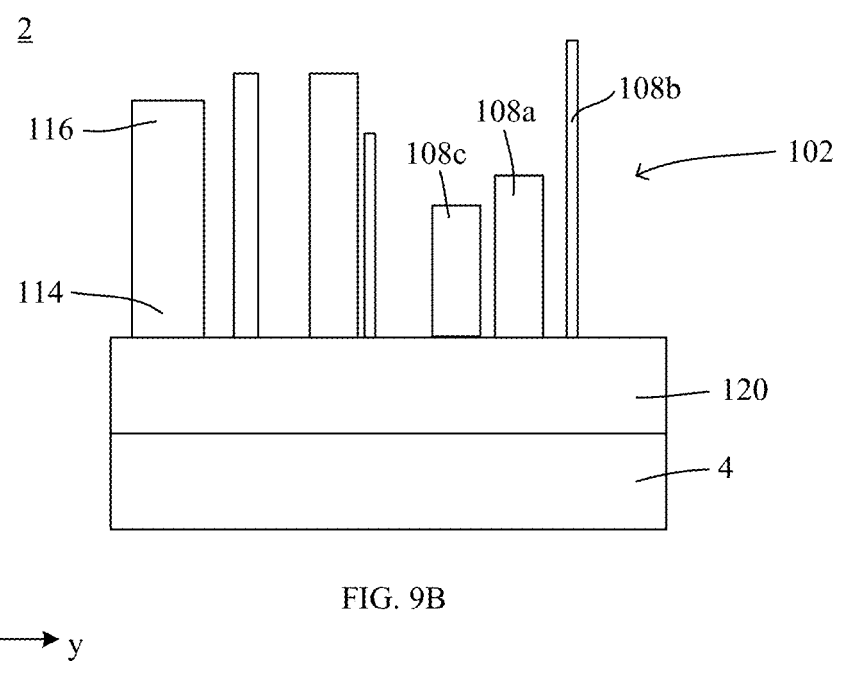

In a certain embodiment, as shown in FIG. 9A (top view of nanowire article 2) and FIG. 9B (cross-section of nanowire article 2 along line A-A shown in FIG. 9A), article 2 includes a plurality of randomly disposed nanowires that includes first randomly disposed nanowire 108a, second randomly disposed nanowire 108b, and third randomly disposed nanowire 108c disposed on buffer layer 120 and substrate 4. Here, buffer layer 120 is a product of disposing a metal nitride on substrate 4 prior to growth of randomly disposed nanowires (108a, 108b, 108c) in an absence of a catalyst. It is contemplated that randomly disposed nanowires (108a, 108b, 108c) are arranged randomly on buffer layer 120 with a random spacing amongst individual randomly disposed nanowires (108a, 108b, 108c).

Nanowires (8, 108a, 108b, 108c) are grown on substrate 4. Substrate 4 can be any material to effect growth of the nanowires. Exemplary substrate 4 materials include a glass (e.g., quartz, sapphire, and the like), polymer (e.g., thermoplastic polymer, thermoset polymer, and the like), metal (e.g., steel, copper, gold, and the like), composite, semiconductor (silicon, germanium, compound semiconductor, nitride thereof, carbide thereof, phosphoric thereof, oxide thereof, and the like), or a combination thereof.

In an embodiment, substrate 4 includes the semiconductor. An exemplary semiconductor is an element from group 11, 12, 13, 14, 15, or 16 (IUPAC nomenclature, which is identical to group I, II, III, IV, V, and VI) of the periodic table such as a Si, Ga, Ge, As, In, Sn, Sb, Te, At, Hf, Zn, and the like, or a combination thereof. According to an embodiment, substrate 4 is, the compound semiconductor such as SiC, SiGe, GaN; a group 13-15 (also referred to as a group III-V) semiconductor such as AlSb, AlAs, Aln, AlP, BN, GaSb, GaAs, GaN, GaP, InSb, InAs, InN, InP, and the like; a group 12-16 (group II-VI) semiconductor such as CdSe, CdS, CdTe, ZnO, ZnSe, ZnS, ZnTe, and the like; a group 11-17 (group I-VII) semiconductor such as CuCl and the like; a group 14-16 (group IV-VI) semiconductor such as PbS, PbTe SnS, and the like; a layer semiconductor such as $PbI_2$, $MoS_2$, GaSe, and the like; an oxide semiconductor such as CuO, Cu$_2$O, and the like; (Al,Ga)N, GaAs, (Al,Ga)As, (In,Ga)As, GaSb, (Al,Ga)Sb, (In,Ga)Sb, as well as nitride, arsenide, or antimonide quaternary III-V alloys; or a combination thereof. Examples of Group III-V ternary alloys include, but are not limited to, (Ga,Al)As, (In,Ga)As, and combinations thereof. Exemplary Group III-V quaternary alloys include (Ga,In)(As,P), (In,Al,Ga)Sb, and the like. Exemplary Group III-nitride alloys include (Ga,Al)N, (Ga,In)N, (Al,In)N, (Ga,Al,In)N, and combinations thereof. Quaternary alloys of the above may also be employed. Additionally, group III-V antimonides, such as GaSb, III-V ternary antimonide alloys, (Al,Ga)Sb, (In,Ga)Sb, and III-V quaternary alloys, (In,Al,Ga)Sb can also be included.

Substrate 4 also can include a supplemental element such as C, H, N, Li, Na, K, Mg, Ca, Sr, Ba, Bi, B, Al, P, S, O, and the like in an amount typically less than an amount of the semiconductor. In an embodiment, substrate 4 includes silicon, and the silicon is optionally doped. According to an embodiment, the semiconductor is an intrinsic semiconductor or an extrinsic semiconductor doped with a selected dopant, e.g., a p-dopant or an n-dopant. In one embodiment, substrate 4 includes a p-dopant. In another embodiment, substrate 4 includes an n-dopant. In a particular embodiment, substrate 4 is p-doped Si. In one embodiment, the substrate is n-doped Si. Substrate 4 can be produced from, e.g., commercially available semiconductor grade p-doped Si having a particular crystalline orientation, e.g., having Miller indices <111>, <100>, and the like. The substrate can be amorphous, polycrystalline, or a single crystal. In an embodiment, substrate 4 has a stacked structure that includes a plurality of semiconductor layers such as by forming films as SiGe/Si/SiGe/Si on Si substrate 4. In some embodiments, substrate 4 includes crystalline domains among amorphous material. In a particular embodiment, substrate 4 is a semiconductor, e.g., silicon, specifically amorphous or single crystalline silicon, more specifically single crystalline silicon, yet more specifically <111> Si or <100> Si.

Superlattice layer 6 disposed on substrate 4 includes a semiconductor. The semiconductor included in superlattice layer 6 can be a same or different than, if present, a semiconductor included in substrate 4. In a particular embodiment, superlattice layer 6 includes a plurality of alternating layers of a first semiconductor in a first layer of superlattice layer 6 and a second semiconductor in a second layer of superlattice layer 6. In a certain embodiment, the first layer is a ternary semiconductor such as AlGaN, and the second layer is a binary semiconductor such as GaN. Without wishing to be bound by theory, it is believed that superlattice layer 6 relieves strain energy, e.g., substrate 4 to accommodate growth of first buffer layer 20.

First buffer layer 20 includes a semiconductor. The semiconductor included in first buffer layer 20 can be a same or different than a semiconductor included in superlattice layer 6. In a particular embodiment, first buffer layer 20 is a binary semiconductor that includes a nitride, oxide, phosphide, silicide, or carbide of the semiconductor element. In some embodiments, the binary semiconductor includes the nitride, oxide, phosphide, silicide, or carbide of gallium, e.g., GaN. In a specific embodiment, first buffer layer 20 is GaN and is a product of low temperature growth referred to as low temperature GaN.

Figure 10A:
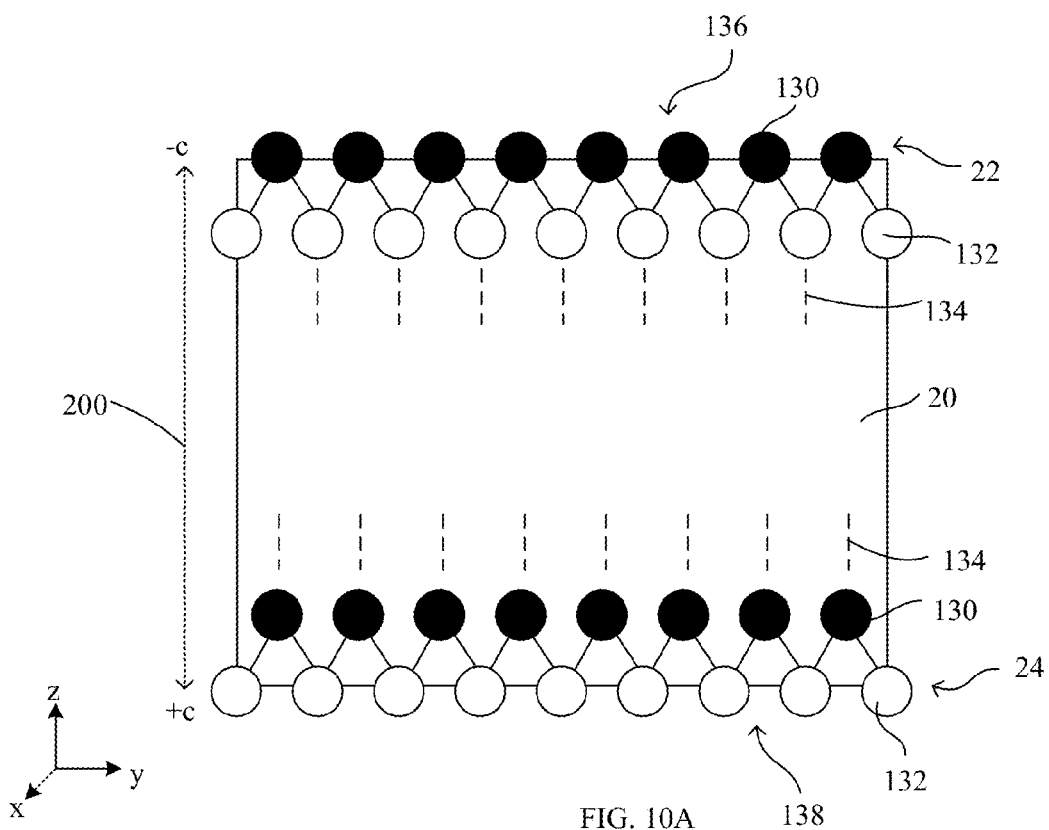
FIGS. 10A and 10B show a cross-section of a first buffer layer.

According to an embodiment, first buffer layer 20 has first polar surface 22 and second polar surface 24, wherein first polar surface 22 and second polar surface 24 have differing polarities. In an embodiment, as shown in FIG. 10A, first polar surface 22 includes negative polar surface 136, and second polar surface 24 includes positive polar surface 138. Here, first buffer layer 20 includes the binary semiconductor that includes first atom 130 that has a greater electron density and is more electronegative compared to second atom 132, which has a lower electron density and is less electronegative compared to first atom 130. The binary semiconductor has repeated atom pattern 134 and includes first atom 130 and second atom 132. In an embodiment, the semiconductor is gallium nitride, wherein first atom 130 is nitrogen, and second at 132 is gallium. Accordingly, negative polar surface 136 includes the N-polar surface, and positive polar surface 138 includes the Ga-polar surface. Here, crystal axis 200 of first buffer layer 20 has +c end at positive polar surface 138 and −c end at negative polar surface 136 such that +c end of crystal axis 200 is directed towards second polar surface 24 and −c end of crystal axis 200 is directed towards first polar surface 22.

Figure 10B:
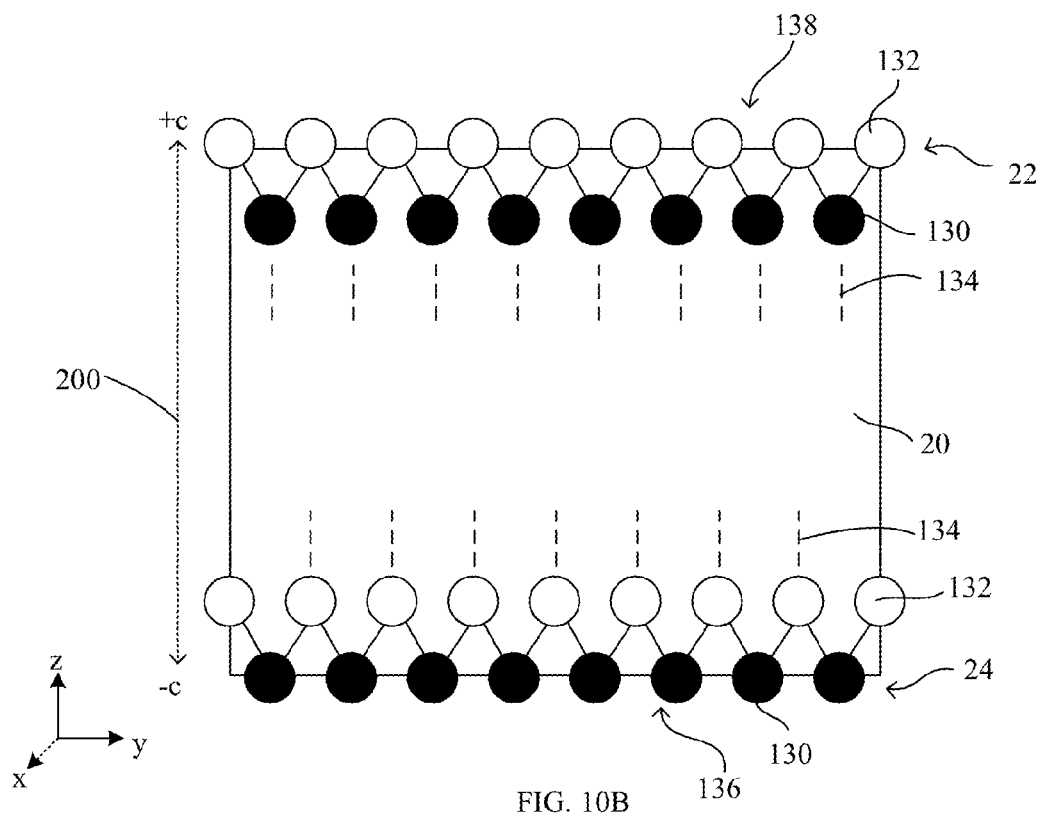

In an alternative embodiment, as shown in FIG. 10B, first polar surface 22 includes positive polar surface 38, and second polar surface 24 includes negative polar surface 136. Here, first buffer layer 20 includes the binary semiconductor that includes first atom 130 that has a greater electron density and is more electronegative compared to second atom 132, which has a lower electron density and is less electronegative compared to first atom 130. The binary semiconductor has repeated atom pattern 134 and includes first atom 130 and second atom 132. In an embodiment, the semiconductor is gallium nitride, wherein first atom 130 is nitrogen, and second at 132 is gallium. Accordingly, negative polar surface 136 includes the N-polar surface, and positive polar surface 138 includes the Ga-polar surface. Here, crystal axis 200 of first buffer layer 20 has +c end at positive polar surface 138 and −c end at negative polar surface 136 such that +c end of crystal axis 200 is directed towards first polar surface 22 and −c end of crystal axis 200 is directed towards second polar surface 24.

Second buffer layer 26 can be a semiconductor. In an embodiment, the semiconductor is the same as the semiconductor in first buffer layer 20. In a certain embodiment, the semiconductor is different than the semiconductor in first buffer layer 20. According to an embodiment, second buffer layer 26 includes a plurality of layers such as a first layer that includes gallium nitride (e.g., low temperature gallium nitride and the like) and a second layer that includes a metal nitride (e.g., aluminum nitride and the like).

Mask 28 through which nanowires 8 grow, e.g., on first polar surface 22 of first substrate for 20, can be a material effective to include the plurality of holes 30 in which patterned growth of nanowires 8 can occur. Exemplary materials for mask 28 include a nitride, phosphide, carbide, or the like of a semiconductor such as those recited for substrate 4, independent of a material selected for substrate 4. According to an embodiment, mask 28 includes silicon nitride.

Nanowires (8, 108a, 108b, 108c) can be a same or different material than first buffer layer 20 or a material recited for substrate 4, is applicable. In an embodiment, the nanowires include a semiconductor. In a certain embodiment, the nanowires include a semiconductor nitride. The semiconductor of the semiconductor nitride is an element selected from group 3 of the periodic table, e.g., boron, aluminum, gallium, indium, thallium, and the like. Exemplary semiconductor nitrides include binary semiconductors (e.g., gallium nitride), ternary semiconductors (e.g., aluminum gallium nitride), and the like. The nanowire can be a single crystal nanowire or can have a core coated with a material such as a semiconductor or a coating for adsorption of the analyte on the nanowires. In a specific embodiment, the nanowires are gallium nitride nanowires. According to a certain embodiment, the nanowires have a polarity orientation, diameter, or length selected by growth conditions first buffer layer 20, nitrogenated layer 100, or buffer layer 120.

According to an embodiment, first buffer layer 20 includes first polar surface 22 having negative polar surface 136 that is the N-polar surface and also includes second polar surface 24 having positive polar surface 138 that is the Ga-polar surface. First buffer layer 20 is disposed on superlattice layer 6 that includes alternating layers of aluminum gallium nitride and gallium nitride. Superlattice layer 6 optionally is disposed on second buffer layer 26 that includes a first layer and includes low temperature gallium nitride disposed on a second layer that includes aluminum nitride, which is disposed on substrate 4 that includes silicon. Without wishing to be bound by theory, it is believed that superlattice layer 6 relieves strain energy between substrate 4 and first buffer layer 20. Mask 28 having a plurality of holes 30 is disposed on first buffer layer 20 to expose negative polar surface 136 for growth of nanowire 8 thereon. Due to an order of negative polar surface 136 and positive polar surface 138 relative to superlattice layer 6, nanowire 8 includes a polarity orientation with respect to superlattice layer 6 that is identical to first buffer layer 20. Here, nanowire 8 can be, e.g., gallium nitride, such that proximate end 14 includes positive polar atoms (i.e., gallium atoms) bonded to atoms of negative polar surface 136 (i.e., nitrogen atoms), and distal end 16 includes negative polar atoms (i.e., nitrogen atoms) that terminate nanowire 8. In this configuration, nanowire 8 is gallium nitride nanowire having polarity orientation with +c axis at proximate end 14 and −c axis at distal end 16.

According to an embodiment, randomly disposed nanowires (108A, 108B, 108C) are formed on nitrogenated layer 100. Nitrogenated layer 100 is produced by nitrogenating substrate 4 to form a nitrogenated layer thereon. As a result, nitrogenated layer 100 includes a nitrogenated form of the material of substrate 4. In an embodiment, substrate 4 is <100> Si, and surface portion of silicon atoms of substrate 4 is nitrogenated to form silicon nitride. It is contemplated that nitrogenated layer 100 includes a gradient in a concentration of nitrogen. Here, nitrogenated layer 100 provides a site for random growth of nanowires (108a, 108b, 108c) in an absence of a catalyst.

In some embodiments, nanowire article 2 includes buffer layer 120 for growth of randomly disposed nanowires (108a, 108b, 108c) thereon. Buffer layer 120 disposed on substrate 4 in an absence of superlattice layer 6 and includes a metal nitride. Exemplary metal nitride include aluminum nitride, gallium nitride, germanium nitride, silicon nitride, and the like. Here, buffer layer 120 provides a site for random growth of nanowires (108a, 108b, 108c) in an absence of a catalyst.

In an embodiment, nanowire article 2 includes substrate 4, the plurality of gallium nitride nanowires 8 disposed on substrate 4, and superlattice layer 6 interposed between substrate 4 and the plurality of gallium nitride nanowires 8. In some embodiments, nanowire article 2 further includes first buffer layer 20 interposed between superlattice layer 6 and the plurality of gallium nitride nanowires 8. Superlattice layer 6 includes gallium nitride, aluminum gallium nitride, or combination thereof. Here, first buffer layer 20 includes first polar surface 22 that includes negative polar surface 136 that is a polar nitrogen surface in direct contact with the plurality of gallium nitride nanowires 8 and second polar surface 24 disposed to be facing away from the plurality of gallium nitride nanowires 8. In some embodiments, second polar surface 24 includes positive polar surface 138 that includes a polar gallium surface, polar aluminum surface, or a combination thereof. In a certain embodiment, individual gallium nitride nanowires 8 of the plurality of gallium nitride nanowires include length axis 10 that is substantially perpendicular to first buffer layer 20. Length axis 10 of individual gallium nitride nanowires 8 includes a crystal axis of nanowires 8 such that a +c crystal axis of the crystal axis extends in a direction away from first buffer layer 20. According to an embodiment, the plurality of gallium nitride nanowires 8 are disposed in a selected pattern on substrate 4, the selected pattern being nonrandom and deterministic, based on growth of the plurality of gallium nitride nanowires 8 in a mask 28 that includes a plurality of holes 30 that exposes first polar surface 22 of first buffer layer 20. In some embodiments, nanowire article 2 further includes a plurality of secondary buffer layers 26 that independently includes gallium nitride, aluminum nitride, or a combination thereof. In a certain embodiment, nanowire article 2 further includes mask 28 that includes a plurality of holes 30, wherein the plurality of gallium nitride nanowires 8 is disposed in the plurality of holes 30 such that, when present, one gallium nitride nanowire 8 is present per hole 30. The plurality of gallium nitride nanowires 8 is configured to receive an analyte and a wavelength of light to desorb the analyte from the plurality of gallium nitride nanowires. Further, the analyte can be ionized in response to desorption from the plurality of gallium nitride nanowires 8. In certain embodiments, the plurality of gallium nitride nanowires 8 is hydrophilic relative to mask 28. In a further embodiment, superlattice layer 6 includes a plurality of alternating layers of a first layer that includes gallium nitride and a second layer that includes aluminum gallium nitride. In a particular embodiment, substrate 4 includes silicon, and mask 28 includes silicon nitride.

Nanowire article 2 can be made in various ways. According to an embodiment, a process for producing nanowire article 2 includes disposing superlattice layer 6 on substrate 4, disposing first buffer layer 20 on superlattice layer 6, contacting first buffer layer 20 with a precursor for forming gallium nitride nanowires; and forming a plurality of gallium nitride nanowires 8 from the precursor on first buffer layer 20 to form nanowire article 2. In some embodiments, the process further includes disposing mask 28 on first buffer layer 20 prior to contacting first buffer layer 20 with the precursor and forming a plurality of holes 30 in mask 28 prior to contacting first buffer layer 20 with the precursor such that the plurality of holes exposes first buffer layer 20 for contact with the precursor. Here, the plurality of gallium nitride nanowires 8 is disposed in the plurality of holes 30 such that, when present, one gallium nitride nanowire 8 is present per hole 30. It is contemplated that individual gallium nitride nanowires 8 of the plurality of gallium nitride nanowires 8 include length axis 10 that is substantially perpendicular to first buffer layer 20. Length axis 10 of the individual gallium nitride nanowires 8 includes a crystal axis such that a −c crystal axis of the crystal axis extends in a direction away from first buffer layer 20.

According to an embodiment, a process for producing randomly disposed nanowires (108a, 108b, 108c) on substrate 4 includes nitrogenating substrate 100 to form nitrogenated layer 100 on substrate 4, contacting nitrogenated layer 4 with a precursor for forming nanowires (108a, 108b, 108c), and forming a plurality of gallium nitride nanowires (108a, 108b, 108c) from the precursor on nitrogenated layer 100 to form nanowire article 2 in an absence of a catalyst.

In a particular embodiment, substrate 4 includes Si <100> that is nitrogenated to form nitrogenated layer 100 followed by growth of gallium nitride nanowires (108a, 108b, 108c), which are randomly disposed on nitrogenated layer 100. Here, growth of randomly disposed gallium nitride nanowires (108a, 108b, 108c) occurs in absence of a catalyst.

In an embodiment, a process for producing randomly disposed nanowires (108a, 108b, 108c) on substrate 4 includes forming buffer layer on substrate 4, contacting buffer layer 120 with a precursor for forming nanowires (108a, 108b, 108c), and forming a plurality of gallium nitride nanowires (108a, 108b, 108c) from the precursor on buffer layer 120 to form nanowire article 2 in an absence of a catalyst. In a particular embodiment, substrate 4 includes Si <111> upon which buffer layer 120 that includes aluminum nitride is formed followed by growth of gallium nitride nanowires (108a, 108b, 108c), which are randomly disposed on buffer layer 120. Here, growth of randomly disposed gallium nitride nanowires (108a, 108b, 108c) occurs in absence of a catalyst.

In a certain embodiment, to form nanowire article 2, substrate 4 is provided. Substrate 4 can be from a commercial source or can be grown in situ. It is contemplated that substrate 4 can be a commercially available silicon wafer. According to an embodiment, layers (6, 20, 26) between substrate 4 and mask 28 are grown by molecular beam epitaxy under a condition to produce an exposed surface (e.g., 12, 22, and the like) that is smooth. In this manner, first polar surface 22 can be made to have a uniform crystal polarity, e.g., a uniform N-polar surface. Without wishing to be bound by theory, it is believed that superlattice layer 6 reduces a propagation of crystalline defects and controls strain in first buffer layer 20, which can be, e.g., gallium nitride. After layers (6, 20, 26) are grown on substrate 4, substrate 4 having disposed layers (6, 20, 26) are subjected to deposition of amorphous silicon nitride to form mask 28. Mask 28 is subjected to patterning by, e.g., electron beam lithography. Holes 30 are dry etched in mask 28. It is contemplated that mass production of this structure can be accomplished by nanoimprint lithography. For nanowire 8 growth, molecular beam epitaxy is used to supply the precursor under selected growth conditions (e.g., temperature of substrate 4, flux of source material, and the like) so that growth of nanowire 8 is initiated on polar surface 22 exposed through holes 30 of mask 28. Consequently, diameter D of nanowire 8 is determined by size D4 of hole 30. Such process can be referred to as selective epitaxial growth of nanowires 8.

In some embodiments, second buffer layer 26 is grown on substrate 4 by contacting substrate 4 with a selected flux of an aluminum atoms and nitrogen atoms, wherein a temperature of substrate 4 is controlled to form a first layer of aluminum nitride. A second layer of second buffer layer 26 includes gallium nitride and is grown on the first layer by controlled introduction of gallium atoms and nitrogen atoms while substrate 4 is held at a low temperature to form the temperature gallium nitride. Subsequently, superlattice layer 6 is grown by depositing a first layer of aluminum gallium nitride and a second layer of gallium nitride. Here, a plurality of alternating aluminum gallium nitride and gallium nitride layers may be included in superlattice layer 6. Thereafter, a low temperature gallium nitride buffer layer formed on superlattice layer 6 as first buffer layer 20, wherein first buffer layer 20 has a controlled crystalline orientation such that first polar surface 22 includes the N-polar surface, and second polar surface 24 includes the Ga-polar surface. Silicon nitride is grown on first buffer layer 20 to form mask 28 that is subjected to etching to form holes 30 that have a selected pattern. Gallium atoms and nitrogen atoms are introduced to first polar surface 22 of first buffer layer 20 through holes 32 form gallium nitride nanowires 8 having a controlled crystal axis directed along length axis 10 of nanowire is 8 with proximate end 14 having substantially gallium atoms, and distal end 16 having substantially nitrogen atoms. Surprisingly, nanowires 8 grow with a uniform diameter and uniform length in the presence of superlattice layer 6 in contrast to conventional belief that nanowires 8 (having a selected direction of the polarity axis along length axis 10) grow without regard to strain relief provided by superlattice layer 6.

Nanowire article 2 has numerous beneficial and advantageous uses. According to an embodiment, a process for preparing an analyte includes providing nanowire article 2, e.g., including mask 28, first buffer layer 20, nanowires 8, and superlattice layer 6 disposed on substrate 4. The process also includes adsorbing the analyte on nanowires 8, subjecting nanowires 8 or the analyte to the radiation, desorbing the analyte from nanowires 8 in response to being subjected to the radiation to prepare the analyte. The analyte can be part of a composition that is disposed on nanowires 8. In some embodiments, the process further includes analyzing the analyte after the analyte has been desorbed from nanowires 8. Here, nanowire article 2 can be disposed in a mass spectrometer or other analytical instrument such that upon desorption of the analyte from nanowires 8, analyte is ionized and mass or spectroscopically analyzed.

In a particular embodiment, a process for analyzing the analyte includes disposing the analyte on a plurality of gallium nitride nanowires of nanowire article 8 (or nanowires 108a, 108b, 108c), subjecting the gallium nitride nanowires to a wavelength of light; desorbing the analyte from the plurality of gallium nitride nanowires in response to subjecting the gallium nitride nanowires to the wavelength of light, and ionizing the analyte desorbed from the plurality of gallium nitride nanowires to analyze the analyte.

In addition to the analyte, the composition is disposed on the nanowires of nanowire article 2 can include a liquid, gas, solid, or a combination thereof. In an embodiment, the composition includes an analyte and a fluid. The analyte can be soluble or insoluble in the fluid. Accordingly, the fluid can be a solvent or fluid medium for suspending the analyte. In some embodiments, the composition includes the analyte in an absence of the fluid. The analyte can be any analyte that can be adsorbed onto nanowires 8. Exemplary analytes include atoms, molecules, ions, polymers, organic molecules, inorganic molecules, biopolymers, cells (e.g., prokaryotic or eukaryotic), bacteria, virus, proteins, amino acids, polypeptides, carbohydrates, and the like. In a particular embodiment, the analyte is a cell that adsorbs on nanowire (8, 108a, 108b, 108c) and desorbs from nanowire (8, 108a, 108b, 108c) in response to being irradiated with, e.g., a wavelength of light and the like subsequently to be released as the analyte without being attached to fluid or a contaminant. Also, the analyte can be ionized after being desorbed or in response to being desorbed from nanowire (8, 108a, 108b, 108c).

According to some embodiments, the analyte adsorbs to nanowire 8 preferentially over mask 28 due to a hydrophilicity-hydrophobicity difference between nanowire 8 and mask 28.

Nanowire article 2 has beneficial and advantageous properties. According to an embodiment, a process for growing nanowires 8 includes subjecting substrate 4 (e.g., silicon) to selective epitaxial growth by, e.g., molecular beam epitaxy to control growth of nanowires 8 to produce nanowires 8 having a selected crystal structure, diameter, location on nanowire article 2, crystal in-plane orientation, polarity, and the like. The process produces nanowires 8 having a reproducibly selected geometry. Nanowires 8 can be produced with a diameter D effective for absorbing the analyte, desorbing the analyte, or ionizing the analyte to produce an ion of the electrostatically charged analyte. Diameter D of nanowire 8 can be from 20 nm to 1000 nm, specifically from 50 nm to 250 nm, and more specifically from 100 nm to 200 nm. The nanowires 8 can have a length from 20 nm to 20,000 nm, specifically greater than 500 nm, also specifically less than 1500 nm. Spacing amongst nanowires 8 can be from 30 nm to 5000 nm, specifically greater than 50 nm, also specifically less than 1000 nm.

Nanowires 8 are disposed in holes 30 a mask 28. Size D4 of holes 30 is effective for growth of nanowires 8. Size D4 can be from 20 nm to 500 nm, specifically greater than 50 nm, also specifically less than 250 nm.

The layers (4, 6, 20, 26, 28) independently have a thickness, e.g., from 5 nanometers (nm) to 500 nm, specifically 50 nanometers to 250 nm, and more specifically 50 nm to 100 nm layers thick. Nanowire article 2 is scalable in size. A longest dimension of a surface area covered by layers (4, 6, 20, 26, 28) on substrate 4 can be from 100 nm to 100 centimeters (cm), specifically 0.3 cm to 2 cm, and more specifically less than 4 centimeters (cm).

Certain layers (4, 6, 20, 26, or 28) independently can be electrically insulating or electrically conductive. Nanowires (8, 108a, 108b, 108c) independently are electrically insulating or electrically conductive. According to an embodiment, nanowires (8, 108a, 108b, 108c) and first buffer layer 20 are electrically conductive such that nanowires (8, 108a, 108b, 108c) and first buffer layer 20 can be electrically biased with a bias potential, e.g., 0 volts up to a damage threshold of nanowire article 2. It is contemplated in some embodiments the bias potential has a continuous wave waveform or pulsed waveform. In some embodiments, nanowire article 2 is heated to desorb the analyte by a heat source in an absence or presence of the aforementioned wavelength of light.

A wavelength of light used to desorb the analyte from the nanowires can be continuous wave or pulsed. The wavelength is selected to desorb the analyte from the nanowires. An exemplary wavelength of light is from 100 nm to 2500 nm. The light can be monochromatic or polychromatic and can be laser light. When pulsed, the light has a repetition rate effective to desorb or ionize the analyte from the nanowires. An exemplary repetition rate of the light pulses is from 0.1 hertz (Hz) to 20 kHz.

The articles and processes herein are illustrated further by the following Examples, which are non-limiting.

EXAMPLES

Example 1

Nanowire Article

FIG. 10 shows a micrograph of a nanowire article. The nanowire article was formed by growing layers (by molecular beam epitaxy) on a Si <111> substrate. The layers included a second buffer layer that included an Al prelayer deposited at 705 C for 20 seconds (s), an aluminum nitride buffer layer approximately 40 nm thick deposited while a temperature of the substrate was ramped from 705 C to 790 C, and a gallium nitride buffer layer 100 nm thick that was deposited at 670 C. The aluminum nitride layer was grown with an aluminum flux that exceeded an active nitrogen flux to form a layer with uniform N-polar upper surface. The superlattice layer included five repetitions of alternating layers of aluminum gallium nitride (aluminum mole fraction estimated at 50%, based on total mole amounts of aluminum and gallium) and gallium nitride, and each layer of the superlattice layer was approximately 6 nm thick and deposited at 745 C. The first buffer layer was a gallium nitride layer that was approximately 150 nm thick and grown at 670° C. Gallium nitride layers were grown with gallium flux that exceeded the active nitrogen flux. The resulting structure was removed from the growth chamber and coated a mask that was 70 nm thick and included low-stress silicon nitride. The silicon nitride layer was patterned with electron beam lithography to generate circular holes in the mask that were approximately 100 nm in diameter. The holes were formed with a carbon tetrafluoride/oxygen reactive ion etch process. The resulting structure was cleaned and returned to the growth chamber. Gallium nitride nanowires were formed in the holes of the mask at a growth temperature of 870 C with gallium flux equivalent to a planar growth rate of 360 nm/h at lower substrate temperatures, and an active nitrogen flux similar to the gallium flux to form the nanowire article. The gallium nitride nanowires had uniform polarity, uniform diameter, and uniform spacing on the first buffer layer. In addition, the nanowire formed in the holes only with one nanowire per hole.

Example 2

Mixed Polarity Layer

Figure 11:
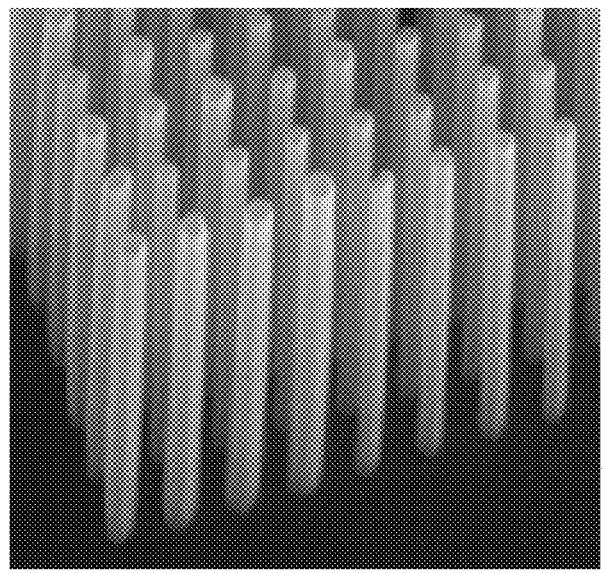
FIG. 11 shows a micrograph of a nanowire article according to Example 1.

FIG. 11 shows a micrograph of gallium nitride nanowires that were grown on a mixed polarity layer as compared with the single polarity layer of Example 1. These nanowires were grown by molecular beam epitaxy using the same fabrications steps as that shown in Example 1, except the aluminum flux was approximately 10% lower, and the aluminum prelayer was grown for half the time of that in Example 1 to produce a second buffer layer that had mixed polarity at the interface with the superlattice layer. The gallium nitride nanowires were grown with one-third of the gallium flux as in Example 1 and at a temperature of 860 C. The mixture of polarities in the second buffer layer propagated to the first buffer layer surface, and gallium nitride nanowires produced on the mixed polarity surface has a mixture of Ga-polar and N-polar crystal orientations as indicated by the two different shapes of the nanowires shown in FIG. 11. The nanowires were either short, faceted nanowires or elongated, thin nanowires.

Example 3

Randomly Disposed Nanowires

Figure 12:
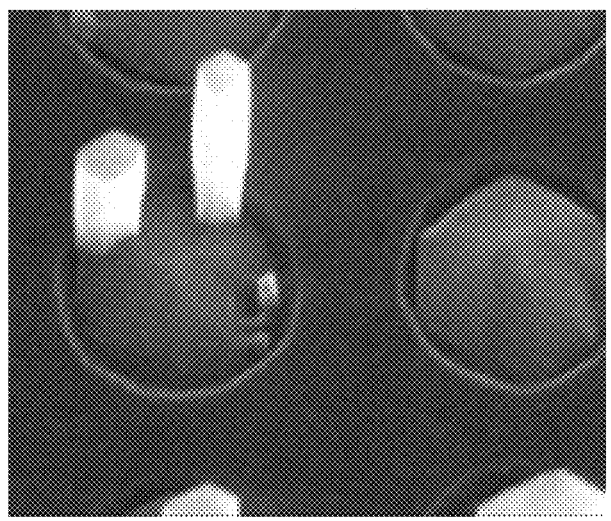
FIG. 12 shows a micrograph of nanowires grown on a mixed polarity layer according to Example 2.
Figure 13:
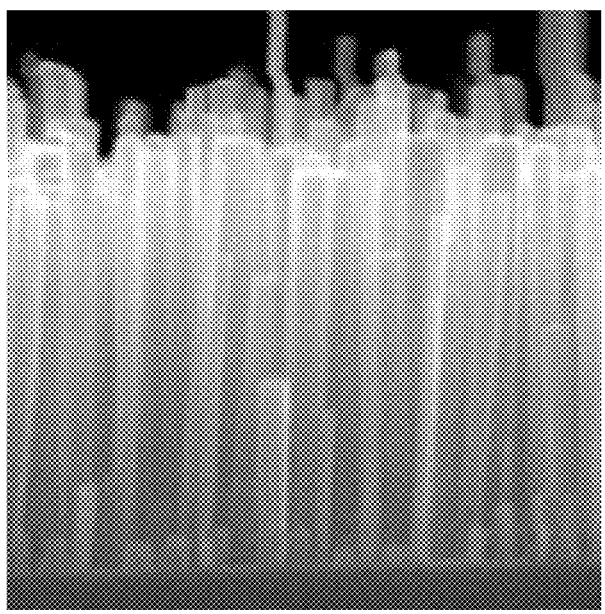
FIG. 13 shows a micrograph of randomly disposed gallium nitride nanowires according to Example 3.

FIG. 12 shows a micrograph of randomly disposed gallium nitride nanowires grown on a Si <100> substrate by molecular beam epitaxy. The Si <100> surface was exposed to a nitrogen plasma for one minute while the Si <100> was maintained at 755° C. to nitride the surface. Gallium nitride nanowires were formed by nucleating at 710° C. for 12 minutes and then continuing growth while ramping the substrate temperature to 825° C.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

Reference throughout this specification to "one embodiment," "particular embodiment," "certain embodiment," "an embodiment," or the like means that a particular feature, structure, or characteristic described in connection with the embodiment is included in at least one embodiment. Thus, appearances of these phrases (e.g., "in one embodiment" or "in an embodiment") throughout this specification are not necessarily all referring to the same embodiment, but may. Furthermore, particular features, structures, or characteristics may be combined in any suitable manner, as would be apparent to one of ordinary skill in the art from this disclosure, in one or more embodiments.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." Further, the conjunction "or" is used to link objects of a list or alternatives and is not disjunctive; rather the elements can be used separately or can be combined together under appropriate circumstances. It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

What is claimed is:

1. A nanowire article comprising:
   a substrate;
   a plurality of nanowires disposed on the substrate, the nanowires comprising a semiconductor nitride, the semiconductor comprising an element selected from group 3 of the periodic table; and
   a superlattice layer interposed between the substrate and the plurality of nanowires.

2. The nanowire article of claim 1, further comprising a first buffer layer interposed between the superlattice layer and the plurality of nanowires.

3. The nanowire article of claim 2, wherein the superlattice layer comprises gallium nitride, aluminum gallium nitride, or a combination comprising at least one of the foregoing.

4. The nanowire article of claim 3, wherein the first buffer layer comprises:
   a first polar surface comprising a polar nitrogen surface that is in direct contact with the plurality of nanowires; and
   a second polar surface disposed to be facing away from the plurality of nanowires.

5. The nanowire articles claim 4, wherein the second polar surface comprises a polar gallium surface, a polar aluminum surface, or a combination comprising at least one of the foregoing polar surfaces.

6. The nanowire article claim 5, wherein individual nanowires of the plurality of nanowires comprise a length axis that is substantially perpendicular to the first buffer layer.

7. The nanowire article of claim 6, wherein the length axis of the individual nanowires comprises a crystal axis such that a −c crystal axis of the crystal axis extends in a direction away from the first buffer layer.

8. The nanowire article of claim 7, wherein the plurality of nanowires are disposed in a selected pattern on the substrate, the selected pattern being nonrandom and deterministic, based on growth of the plurality of nanowires in a mask that comprises a plurality of holes that expose the first buffer layer.

9. The nanowire article of claim 7, further comprising a plurality of secondary buffer layers that independently comprises gallium nitride, aluminum nitride, or a combination comprising at least one of the foregoing.

10. The nanowire article of claim 7, further comprising a mask that comprises a plurality of holes,
    wherein the plurality of nanowires is disposed in the plurality of holes such that, when present, one nanowire is present per hole.

11. The nanowire article of claim 1, wherein the plurality of nanowires is configured to receive an analyte and a wavelength of light to desorb the analyte from the plurality of nanowires such that the analyte is ionized in response to desorption from the plurality of nanowires.

12. The nanowire article of claim 11, wherein the plurality of nanowires is hydrophilic relative to the mask.

13. The nanowire article of claim 1, wherein the superlattice layer comprises a plurality of alternating layers of a first layer comprising gallium nitride and a second layer comprising aluminum gallium nitride, and the plurality of nanowires comprises gallium nitride.

14. A process for producing a nanowire article, the process comprising:
    disposing a superlattice layer on a substrate;
    disposing a first buffer layer on the superlattice layer;
    contacting the first buffer layer with a precursor; and
    forming a plurality of nanowires from the precursor on the first buffer layer to form the nanowire article, the nanowires comprising a semiconductor nitride, the semiconductor comprising an element selected from group 3 of the periodic table.

15. The process of claim 14, further comprising:
    disposing a mask on the first buffer layer prior to contacting the first buffer layer with the precursor; and
    forming a plurality of holes in the mask prior to contacting the first buffer layer with the precursor, the plurality of holes exposing the first buffer layer for contact with the precursor.

16. The process of claim 15, wherein the plurality of nanowires is disposed in the plurality of holes such that, when present, one nanowire is present per hole.

17. The process of claim 16, further comprising:
disposing an analyte on the plurality of nanowires;
subjecting the nanowires to a wavelength of light;
desorbing the analyte from the plurality of nanowires in response to subjecting the nanowires to the wavelength of light; and
ionizing the analyte desorbed from the plurality of nanowires.

18. The process of claim 16, wherein individual nanowires of the plurality of nanowires comprise a length axis that is substantially perpendicular to the first buffer layer.

19. The nanowire article of claim 18, wherein the length axis of the individual nanowires comprises a crystal axis such that a −c crystal axis of the crystal axis extends in a direction away from the first buffer layer.

20. A process for producing a nanowire article, the process comprising:
nitrogenating a substrate to form a nitrogenated layer on the substrate;
contacting the nitrogenated layer with a precursor; and
forming a plurality of gallium nitride nanowires from the precursor on the nitrogenated layer to form the nanowire article in an absence of a catalyst,
wherein individual gallium nitride nanowires of the plurality of gallium nitride nanowires comprise a length axis that is substantially perpendicular to the nitrogenated layer.

* * * * *